United States Patent
Usher

(10) Patent No.: US 11,693,617 B2
(45) Date of Patent: ***Jul. 4, 2023

(54) METHOD AND DEVICE FOR ACUTE SOUND DETECTION AND REPRODUCTION

(71) Applicant: Staton Techiya LLC, Delray Beach, FL (US)

(72) Inventor: John Usher, Beer (GB)

(73) Assignee: Staton Techiya LLC, Delray Beach, FL (US)

( * ) Notice: Subject to any disclaimer, the term of this patent is extended or adjusted under 35 U.S.C. 154(b) by 105 days.

This patent is subject to a terminal disclaimer.

(21) Appl. No.: 17/013,538

(22) Filed: Sep. 5, 2020

(65) Prior Publication Data

US 2020/0401368 A1    Dec. 24, 2020

Related U.S. Application Data

(63) Continuation of application No. 16/227,695, filed on Dec. 20, 2018, now Pat. No. 10,824,388, which is a
(Continued)

(51) Int. Cl.
*G06F 3/16* (2006.01)
*G10L 25/78* (2013.01)
(Continued)

(52) U.S. Cl.
CPC .............. *G06F 3/165* (2013.01); *G10L 15/22* (2013.01); *G10L 21/034* (2013.01); *G10L 25/78* (2013.01);
(Continued)

(58) Field of Classification Search
CPC ........ G06F 3/165; G10L 15/22; G10L 21/034
See application file for complete search history.

(56) References Cited

U.S. PATENT DOCUMENTS

| 3,876,843 A | 4/1975 | Moen |
| 4,054,749 A | 10/1977 | Suzuki et al. |

(Continued)

FOREIGN PATENT DOCUMENTS

| EP | 1385324 A1 | 1/2004 |
| EP | 1401240 A1 | 3/2004 |

(Continued)

OTHER PUBLICATIONS

Bernard Widrow, John R. Glover Jr., John M. McCool, John Kaunitz, Charles S. Williams, Robert H. Hearn, James R. Zeidler, Eugene Dong Jr, and Robert C. Goodlin, Adaptive Noise Cancelling: Principles and Applications, Proceedings of The IEEE, vol. 63, No. 12, Dec. 1975.

(Continued)

*Primary Examiner* — Mark Villena
(74) *Attorney, Agent, or Firm* — Akerman LLP; Peter A. Chiabotti

(57) ABSTRACT

An electronic device or method for adjusting a gain on a voice operated control system can include one or more processors and a memory having computer instructions. The instructions, when executed by the one or more processors causes the one or more processors to perform the operations of receiving a first microphone signal, receiving a second microphone signal, updating a slow time weighted ratio of the filtered first and second signals, and updating a fast time weighted ratio of the filtered first and second signals. The one or more processors can further perform the operations of calculating an absolute difference between the fast time weighted ratio and the slow time weighted ratio, comparing the absolute difference with a threshold, and increasing the gain when the absolute difference is greater than the threshold. Other embodiments are disclosed.

20 Claims, 3 Drawing Sheets

Exemplary configuration of VAD system.

Related U.S. Application Data continuation of application No. 14/922,475, filed on Oct. 26, 2015, now Pat. No. 10,163,453.

(60) Provisional application No. 62/068,273, filed on Oct. 24, 2014.

(51) Int. Cl.

| | | |
|---|---|---|
| *H03G 3/34* | (2006.01) | |
| *G10L 21/034* | (2013.01) | |
| *G10L 15/22* | (2006.01) | |
| *H04R 1/40* | (2006.01) | |
| *H04R 3/00* | (2006.01) | |
| *H04R 29/00* | (2006.01) | |
| *H04R 1/10* | (2006.01) | |

(52) U.S. Cl.
CPC ............ *H03G 3/341* (2013.01); *H04R 1/406* (2013.01); *H04R 3/005* (2013.01); *H04R 1/1083* (2013.01); *H04R 29/006* (2013.01)

(56) References Cited

U.S. PATENT DOCUMENTS

| | | | |
|---|---|---|---|
| 4,088,849 A | 5/1978 | Usami et al. | |
| 4,947,440 A | 8/1990 | Bateman et al. | |
| 5,208,867 A | 5/1993 | Stites, III | |
| 5,251,263 A | 10/1993 | Andrea | |
| 5,267,321 A | 11/1993 | Langberg | |
| 5,317,273 A | 5/1994 | Hanson | |
| 5,479,522 A * | 12/1995 | Lindemann | H04R 25/558 |
| | | | 381/23.1 |
| 5,524,056 A | 6/1996 | Killion et al. | |
| 5,550,923 A | 8/1996 | Hotvet | |
| 5,577,511 A | 11/1996 | Killion | |
| 5,903,868 A | 5/1999 | Yuen et al. | |
| 5,946,050 A | 8/1999 | Wolff | |
| 6,021,207 A | 2/2000 | Puthuff et al. | |
| 6,021,325 A | 2/2000 | Hall | |
| 6,028,514 A | 2/2000 | Lemelson | |
| 6,056,698 A | 5/2000 | Iseberg | |
| 6,163,338 A | 12/2000 | Johnson et al. | |
| 6,163,508 A | 12/2000 | Kim et al. | |
| 6,226,389 B1 | 5/2001 | Lemelson et al. | |
| 6,298,323 B1 | 10/2001 | Kaemmerer | |
| 6,359,993 B2 | 3/2002 | Brimhall | |
| 6,400,652 B1 | 6/2002 | Goldberg et al. | |
| 6,408,272 B1 | 6/2002 | White | |
| 6,415,034 B1 | 7/2002 | Hietanen | |
| 6,567,524 B1 | 5/2003 | Svean et al. | |
| 6,647,368 B2 | 11/2003 | Nemirovski | |
| RE38,351 E | 12/2003 | Iseberg et al. | |
| 6,661,901 B1 | 12/2003 | Svean et al. | |
| 6,728,385 B2 | 4/2004 | Kvaloy et al. | |
| 6,748,238 B1 | 6/2004 | Lau | |
| 6,754,359 B1 | 6/2004 | Svean et al. | |
| 6,738,482 B1 | 9/2004 | Jaber | |
| 6,804,638 B2 | 10/2004 | Fiedler | |
| 6,804,643 B1 | 10/2004 | Kiss | |
| 7,003,099 B1 | 2/2006 | Zhang | |
| 7,072,482 B2 | 7/2006 | Van Doorn et al. | |
| 7,107,109 B1 | 9/2006 | Nathan et al. | |
| 7,158,933 B2 | 1/2007 | Balan | |
| 7,177,433 B2 | 2/2007 | Sibbald | |
| 7,209,569 B2 | 4/2007 | Boesen | |
| 7,280,849 B1 | 10/2007 | Bailey | |
| 7,430,299 B2 | 9/2008 | Armstrong et al. | |
| 7,433,714 B2 | 10/2008 | Howard et al. | |
| 7,444,353 B1 | 10/2008 | Chen | |
| 7,450,730 B2 | 11/2008 | Bertg et al. | |
| 7,464,029 B2 | 12/2008 | Visser et al. | |
| 7,477,756 B2 | 1/2009 | Wickstrom et al. | |
| 7,512,245 B2 | 3/2009 | Rasmussen | |
| 7,529,379 B2 | 5/2009 | Zurek | |
| 7,562,020 B2 | 6/2009 | Le et al. | |
| 7,756,285 B2 | 7/2010 | Sjursen et al. | |
| 7,778,434 B2 | 8/2010 | Juneau et al. | |
| 7,853,031 B2 | 12/2010 | Hamacher | |
| 7,903,826 B2 | 3/2011 | Boersma | |
| 7,920,557 B2 | 4/2011 | Moote | |
| 7,936,885 B2 | 5/2011 | Frank | |
| 8,014,553 B2 | 9/2011 | Radivojevic et al. | |
| 8,018,337 B2 | 9/2011 | Jones | |
| 8,045,840 B2 | 10/2011 | Murata | |
| 8,150,044 B2 | 4/2012 | Goldstein | |
| 8,162,846 B2 | 4/2012 | Epley | |
| 8,189,803 B2 | 5/2012 | Bergeron | |
| 8,270,629 B2 | 9/2012 | Bothra | |
| 8,437,480 B2 * | 5/2013 | Zong | H03G 9/02 |
| | | | 381/71.11 |
| 8,477,955 B2 | 7/2013 | Engle | |
| 8,493,204 B2 | 7/2013 | Wong et al. | |
| 8,577,062 B2 | 11/2013 | Goldstein | |
| 8,600,086 B2 | 12/2013 | Jensen et al. | |
| 8,611,560 B2 | 12/2013 | Goldstein | |
| 8,750,295 B2 | 6/2014 | Liron | |
| 8,774,433 B2 | 7/2014 | Goldstein | |
| 8,855,343 B2 | 10/2014 | Usher | |
| 8,935,164 B2 * | 1/2015 | Turnbull | G10L 15/20 |
| | | | 704/226 |
| 9,037,458 B2 | 5/2015 | Park et al. | |
| 9,053,697 B2 | 6/2015 | Park | |
| 9,113,240 B2 | 8/2015 | Ramakrishman | |
| 9,123,343 B2 | 9/2015 | Kurki-Suonio | |
| 9,135,797 B2 | 9/2015 | Couper et al. | |
| 9,191,740 B2 | 11/2015 | McIntosh | |
| 9,532,139 B1 | 12/2016 | Lu et al. | |
| 9,628,896 B2 | 4/2017 | Ichimura | |
| 10,171,922 B2 | 1/2019 | Merks | |
| 10,652,672 B2 | 5/2020 | Merks | |
| 2001/0046304 A1 | 11/2001 | Rast | |
| 2002/0106091 A1 | 8/2002 | Furst et al. | |
| 2002/0118798 A1 | 8/2002 | Langhart et al. | |
| 2002/0193130 A1 | 12/2002 | Yang | |
| 2003/0033152 A1 | 2/2003 | Cameron | |
| 2003/0035551 A1 | 2/2003 | Light | |
| 2003/0130016 A1 | 7/2003 | Matsuura | |
| 2003/0161097 A1 | 8/2003 | Le et al. | |
| 2003/0165246 A1 | 9/2003 | Kvaloy et al. | |
| 2003/0198359 A1 | 10/2003 | Killion | |
| 2004/0042103 A1 | 3/2004 | Mayer | |
| 2004/0044520 A1 * | 3/2004 | Chen | G10L 19/06 |
| | | | 704/E19.044 |
| 2004/0109668 A1 | 6/2004 | Stuckman | |
| 2004/0125965 A1 | 7/2004 | Alberth, Jr. et al. | |
| 2004/0133421 A1 | 7/2004 | Burnett | |
| 2004/0190737 A1 | 9/2004 | Kuhnel et al. | |
| 2004/0196992 A1 | 10/2004 | Ryan | |
| 2004/0202340 A1 | 10/2004 | Armstrong | |
| 2004/0203351 A1 | 10/2004 | Shearer et al. | |
| 2005/0058313 A1 | 3/2005 | Victorian | |
| 2005/0071158 A1 | 3/2005 | Byford | |
| 2005/0078838 A1 | 4/2005 | Simon | |
| 2005/0102142 A1 | 5/2005 | Soufflet | |
| 2005/0123146 A1 | 6/2005 | Voix et al. | |
| 2005/0207605 A1 | 9/2005 | Dehe | |
| 2005/0227674 A1 | 10/2005 | Kopra | |
| 2005/0276420 A1 * | 12/2005 | Davis | H04S 5/005 |
| | | | 381/20 |
| 2005/0281422 A1 | 12/2005 | Armstrong | |
| 2005/0281423 A1 | 12/2005 | Armstrong | |
| 2005/0283369 A1 | 12/2005 | Clauser et al. | |
| 2005/0288057 A1 | 12/2005 | Lai et al. | |
| 2006/0020451 A1 * | 1/2006 | Kushner | B63C 11/26 |
| | | | 704/226 |
| 2006/0064037 A1 | 3/2006 | Shalon et al. | |
| 2006/0067551 A1 | 3/2006 | Cartwright et al. | |
| 2006/0083387 A1 | 4/2006 | Emoto | |
| 2006/0083395 A1 | 4/2006 | Allen et al. | |
| 2006/0092043 A1 | 5/2006 | Lagassey | |
| 2006/0173563 A1 | 8/2006 | Borovitski | |
| 2006/0182287 A1 | 8/2006 | Schulein | |
| 2006/0195322 A1 | 8/2006 | Broussard et al. | |
| 2006/0204014 A1 | 9/2006 | Isenberg et al. | |

(56) References Cited

U.S. PATENT DOCUMENTS

| | | |
|---|---|---|
| 2006/0287014 A1 | 12/2006 | Matsuura |
| 2007/0043563 A1 | 2/2007 | Comerford et al. |
| 2007/0014423 A1 | 4/2007 | Darbut |
| 2007/0086600 A1 | 4/2007 | Boesen |
| 2007/0092087 A1 | 4/2007 | Bothra |
| 2007/0100637 A1 | 5/2007 | McCune |
| 2007/0143820 A1 | 6/2007 | Pawlowski |
| 2007/0160243 A1 | 7/2007 | Dijkstra |
| 2007/0189544 A1 | 8/2007 | Rosenberg |
| 2007/0223717 A1 | 9/2007 | Boersma |
| 2007/0253569 A1 | 11/2007 | Bose |
| 2007/0276657 A1* | 11/2007 | Gournay ............... G10L 21/04 704/203 |
| 2007/0291953 A1 | 12/2007 | Ngia et al. |
| 2008/0037801 A1 | 2/2008 | Alves et al. |
| 2008/0063228 A1 | 3/2008 | Mejia |
| 2008/0130908 A1 | 6/2008 | Cohen |
| 2008/0159547 A1 | 7/2008 | Schuler |
| 2008/0165988 A1 | 7/2008 | Terlizzi et al. |
| 2008/0221880 A1 | 9/2008 | Cerra et al. |
| 2009/0010456 A1 | 1/2009 | Goldstein et al. |
| 2009/0024234 A1 | 1/2009 | Archibald |
| 2009/0076821 A1 | 3/2009 | Brenner |
| 2009/0286515 A1 | 5/2009 | Othmer |
| 2010/0061564 A1 | 3/2010 | Clemow et al. |
| 2010/0086139 A1* | 4/2010 | Nicolino, Jr. .......... G10K 15/02 381/56 |
| 2010/0086141 A1* | 4/2010 | Nicolino, Jr. ............ H04R 5/04 381/57 |
| 2010/0119077 A1 | 5/2010 | Platz |
| 2010/0296668 A1 | 11/2010 | Lee et al. |
| 2010/0328224 A1 | 12/2010 | Kerr et al. |
| 2011/0055256 A1 | 3/2011 | Phillips |
| 2011/0096939 A1 | 4/2011 | Ichimura |
| 2011/0187640 A1 | 8/2011 | Jacobsen et al. |
| 2011/0264447 A1 | 10/2011 | Visser et al. |
| 2011/0293103 A1 | 12/2011 | Park et al. |
| 2012/0123772 A1* | 5/2012 | Thyssen ............. G10L 21/0208 704/226 |
| 2012/0170412 A1 | 7/2012 | Calhoun |
| 2013/0170660 A1* | 7/2013 | Kristensen ............ H04R 25/30 381/60 |
| 2013/0188796 A1* | 7/2013 | Kristensen ............ H04R 25/70 381/60 |
| 2013/0297305 A1* | 11/2013 | Turnbull ................. G10L 15/20 704/E15.039 |
| 2013/0329912 A1* | 12/2013 | Krishnaswamy .... H03G 3/3005 381/107 |
| 2014/0122092 A1 | 5/2014 | Goldstein |
| 2014/0229170 A1* | 8/2014 | Atti ........................ G10L 19/03 704/225 |
| 2016/0049915 A1* | 2/2016 | Wang ...................... G10L 25/30 381/107 |
| 2016/0058378 A1 | 3/2016 | Wisby et al. |
| 2016/0078879 A1* | 3/2016 | Lu .......................... G10L 25/81 381/56 |
| 2016/0104452 A1 | 4/2016 | Guan et al. |
| 2016/0165361 A1 | 6/2016 | Miller et al. |
| 2018/0122400 A1 | 5/2018 | Rasmussen |

FOREIGN PATENT DOCUMENTS

| | | |
|---|---|---|
| EP | 1519625 A2 | 3/2005 |
| EP | 1640972 A1 | 3/2006 |
| EP | 2146519 | 6/2012 |
| EP | 2146519 B1 | 6/2012 |
| EP | 2884763 | 6/2015 |
| EP | 2884763 B1 | 5/2019 |
| JP | H0877468 A | 3/1996 |
| JP | H10162283 A | 6/1998 |
| JP | 3353701 B2 | 12/2002 |
| WO | 9326085 A1 | 12/1993 |
| WO | 2004114722 A1 | 12/2004 |
| WO | 2006037156 A1 | 4/2006 |
| WO | 2006054698 A1 | 5/2006 |
| WO | 2007092660 A1 | 8/2007 |
| WO | 2008050583 A1 | 5/2008 |
| WO | 2009023784 A1 | 2/2009 |
| WO | 2012097150 A1 | 7/2012 |

OTHER PUBLICATIONS

Samsung Electronics Co., Ltd., and Samsung Electronics, America, Inc., v. Staton Techiya, LLC, IPR2022-00282, Dec. 21, 2021.
Samsung Electronics Co., Ltd., and Samsung Electronics, America, Inc., v. Staton Techiya, LLC, IPR2022-00242, Dec. 23, 2021.
Samsung Electronics Co., Ltd., and Samsung Electronics, America, Inc., v. Staton Techiya, LLC, IPR2022-00243, Dec. 23, 2021.
Samsung Electronics Co., Ltd., and Samsung Electronics, America, Inc., v. Staton Techiya, LLC, IPR2022-00234, Dec. 21, 2021.
Samsung Electronics Co., Ltd., and Samsung Electronics, America, Inc., v. Staton Techiya, LLC, IPR2022-00253, Jan. 18, 2022.
Samsung Electronics Co., Ltd., and Samsung Electronics, America, Inc., v. Staton Techiya, LLC, IPR2022-00324, Jan. 13, 2022.
Samsung Electronics Co., Ltd., and Samsung Electronics, America, Inc., v. Staton Techiya, LLC, IPR2022-00281, Jan. 18, 2022.
Samsung Electronics Co., Ltd., and Samsung Electronics, America, Inc., v. Staton Techiya, LLC, IPR2022-00302, Jan. 13, 2022.
Samsung Electronics Co., Ltd., and Samsung Electronics, America, Inc., v. Staton Techiya, LLC, IPR2022-00369, Feb. 18, 2022.
Samsung Electronics Co., Ltd., and Samsung Electronics, America, Inc., v. Staton Techiya, LLC, IPR2022-00388, Feb. 18, 2022.
Samsung Electronics Co., Ltd., and Samsung Electronics, America, Inc., v. Staton Techiya, LLC, IPR2022-00410, Feb. 18, 2022.
Samsung Electronics Co., Ltd., and Samsung Electronics, America, Inc., v. Staton Techiya, LLC, IPR2022-01078, Jun. 9, 2022.
Samsung Electronics Co., Ltd., and Samsung Electronics, America, Inc., v. Staton Techiya, LLC, IPR2022-01099, Jun. 9, 2022.
Samsung Electronics Co., Ltd., and Samsung Electronics, America, Inc., v. Staton Techiya, LLC, IPR2022-01106, Jun. 9, 2022.
Samsung Electronics Co., Ltd., and Samsung Electronics, America, Inc., v. Staton Techiya, LLC, IPR2022-01098, Jun. 9, 2022.
U.S. Appl. No. 90/015,146, Samsung Electronics Co., Ltd. and Samsung Electronics, America, Inc., Request for Ex Parte Reexamination of U.S. Pat. No. 10,979,836.
Olwal, A. and Feiner S. Interaction Techniques Using Prosodic Features of Speech and Audio Localization. Proceedings of IUI 2005 (International Conference on Intelligent User Interfaces), San Diego, CA, Jan. 9-12, 2005, p. 284-286.
Bernard Widrow, John R. Glover Jr., John M. McCool, John Kaunitz, Charles S. Williams, Robert H. Heam, James R. Zeidler, Eugene Dong Jr, and Robert C. Goodlin, Adaptive Noise Cancelling: Principles and Applications, Proceedings of the IEEE, vol. 63, No. 12, Dec. 1975.
Mauro Dentino, John M. McCool, and Bernard Widrow, Adaptive Filtering in the Frequency Domain, Proceedings of the IEEE, vol. 66, No. 12, Dec. 1978.

* cited by examiner

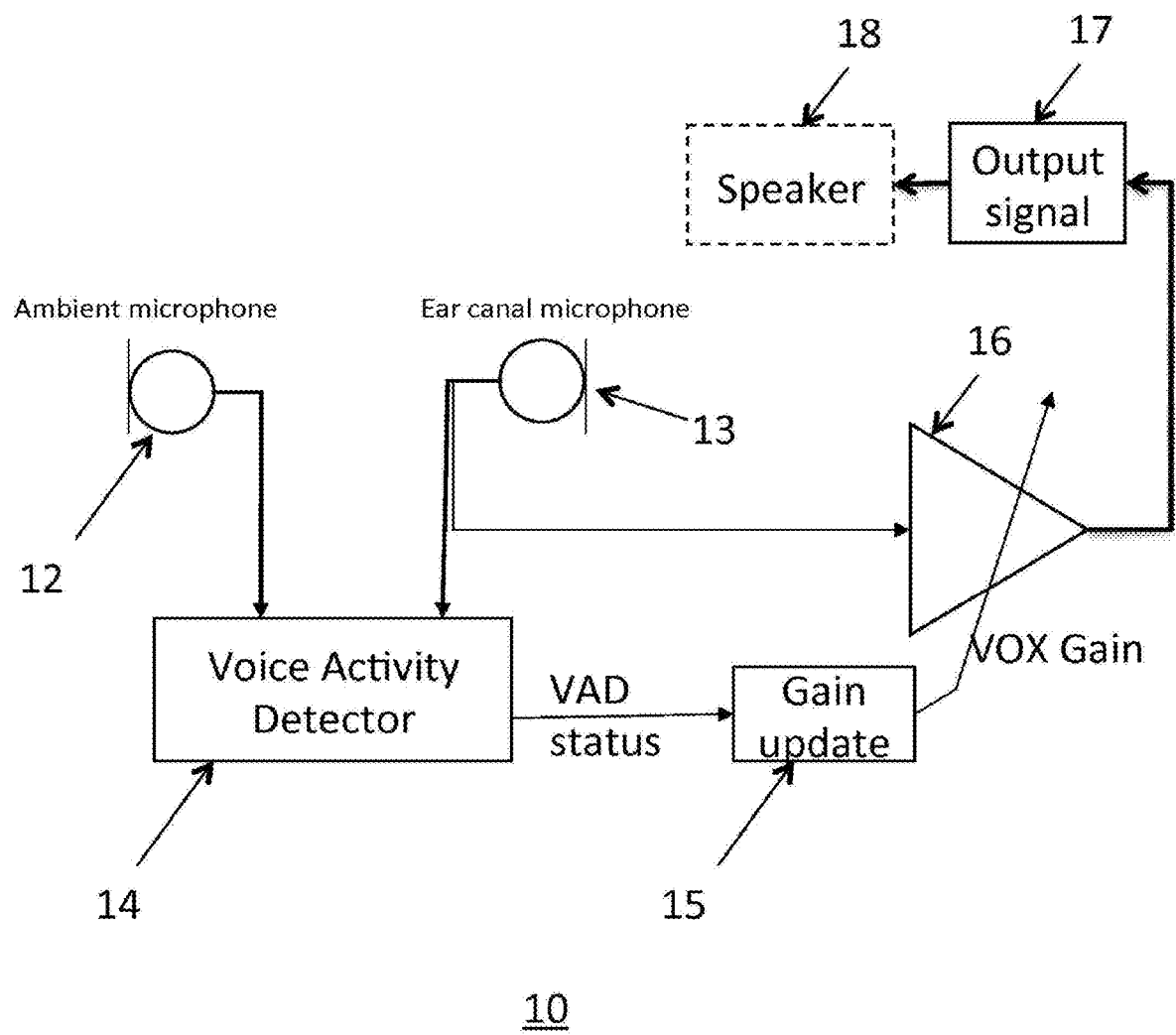
FIG. 1: Exemplary configuration of VAD system.

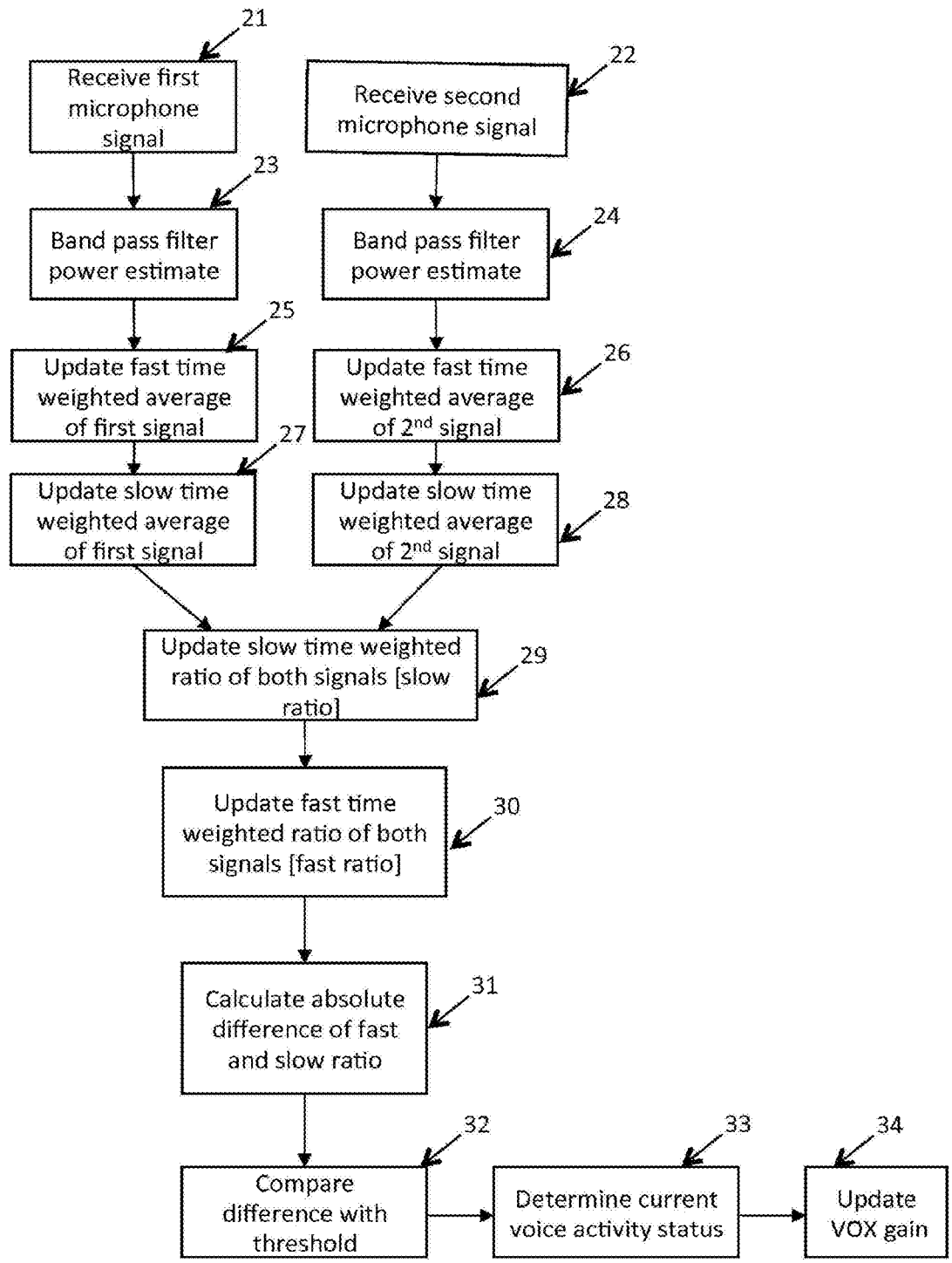
FIG. 2: Exemplary method for determining voice activity status

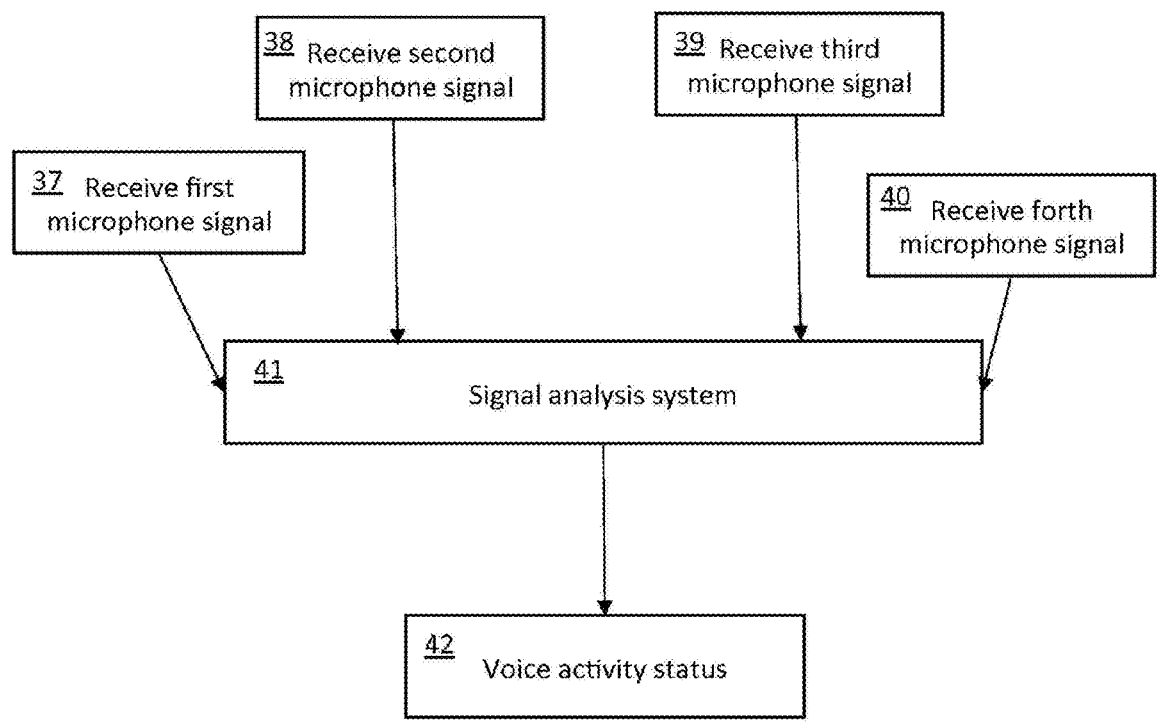
FIG. 3: Overview of system for determining voice activity status.

METHOD AND DEVICE FOR ACUTE SOUND DETECTION AND REPRODUCTION

CROSS-REFERENCE TO RELATED APPLICATION(S)

This application is a continuation of and claiming priority to U.S. patent application Ser. No. 16/227,695, filed 20 Dec. 2018, which is a continuation of and claims priority to U.S. patent application Ser. No. 14/922,475, filed on Oct. 26, 2015, which claims priority to U.S. Provisional Patent Application No. 62/068,273, filed on Oct. 24, 2014, which are both hereby incorporated by reference in their entireties.

FIELD OF THE INVENTION

The present embodiments relate to detection of voice activity in noisy environments.

BACKGROUND OF THE INVENTION

Robust voice activity detection in noisy sound environments is a very difficult problem when using a small device mounted in the ear. Such systems that rely on using fixed thresholds often suffer from false positives and false negatives.

SUMMARY OF THE INVENTION

A method of adjusting a gain on a voice operated control system can include receiving a first microphone signal, receiving a second microphone signal, updating a slow time weighted ratio of the filtered first and second signals, and updating a fast time weighted ratio of the filtered first and second signals. The method can further include calculating an absolute difference between the fast time weighted ratio and the slow time weighted ratio, comparing the absolute difference with a threshold, and increasing the gain when the absolute difference is greater than the threshold. In some embodiments the threshold can be fixed. In some embodiments the method can further include band limiting or band pass filtering the first microphone signal to provide a filtered first signal, band limiting or band pass filtering the second microphone signal to provide a filtered second signal, calculating a power estimate of the filtered first signal including a fast time weighted average and a slow time weighted average of the filtered first signal, and calculating a power estimate of the filtered second signal including a fast time weighted average and a slow time weighed average of the filtered second signal. In some embodiments the threshold is dependent on the slow time weighted average. In some embodiments, the threshold value is set to a time averaged value of the absolute difference and in some embodiments the threshold value is set to the time averaged value of the absolute difference using a leaky integrator used for time smoothing. The step of band limiting or band pass filtering can use a weighted fast Fourier transform operation. In some embodiments, the method can further include determining a current voice activity status based on the comparison step. In some embodiments, the method can further include determining a current voice activity status using Singular Value Decomposition, a neural net system, or a bounded probability value.

The embodiments can also include an electronic device for adjusting a gain on a voice operated control system which can include one or more processors and a memory having computer instructions. The instructions, when executed by the one or more processors causes the one or more processors to perform the operations of receiving a first microphone signal, receiving a second microphone signal, updating a slow time weighted ratio of the filtered first and second signals, and updating a fast time weighted ratio of the filtered first and second signals. The one or more processors can further perform the operations of calculating an absolute difference between the fast time weighted ratio and the slow time weighted ratio, comparing the absolute difference with a threshold, and increasing the gain when the absolute difference is greater than the threshold. In some embodiments, adjusting or increasing the gain involves adjusting a gain of an overall system or of a total output. In some embodiments, adjusting the gain involves adjusting the gain from a first microphone, from a second microphone or from both. In some embodiments, adjusting the gain involves adjusting the gain at the output of a VAD or comparator or other output. In some embodiments, adjusting the gain can involve any combination of gain adjustment mentioned above.

In some embodiments, electronic device can further include the memory having instructions when executed by the one or more processors to cause the one or more processors to perform the operations of band limiting or band pass filtering the first microphone signal to provide filtered first signal, band limiting or band pass filtering the second microphone signal to provide a filtered second signal, calculating a power estimate of the filtered first signal including a fast time weighted average and a slow time weighted average of the filtered first signal, and calculating a power estimate of the filtered second signal including a fast time weighted average and a slow time weighed average of the filtered second signal. In some embodiments the threshold is fixed or the threshold is dependent on the slow time weighted average. In some embodiments, the first microphone signal is received by an ambient signal microphone and the second microphone signal is received by a ear canal microphone. The ambient signal microphone and the ear canal microphone can be part of an earphone device having a sound isolating barrier or a partially sound isolating barrier to isolate the ear canal microphone from an ambient environment. The earphone device can be any number of devices including, but not limited to a headset, earpiece, headphone, ear bud or other type of earphone device. In some embodiments, the sound isolating barrier or partially sound isolating barrier is an inflatable balloon or foam plug. In some embodiments, the memory further includes instructions causing the operation of determining a current voice activity status based on the comparison step. In some embodiments, the memory further includes instructions causing the operation of determining a current voice activity status using Singular Value Decomposition, neural net systems, or a bounded probability value. In some embodiments, the first microphone signal is optionally processed using an analog or a digital band-pass filter and in some embodiments the second microphone signal is optionally processed using an analog or a digital band-pass filter. In some embodiments, at least one characteristic of the first or second microphone signals includes a short-term power estimate.

BRIEF DESCRIPTION OF THE DRAWINGS

The invention may be understood from the following detailed description when read in connection with the accompanying drawing. It is emphasized, according to common practice, that various features of the drawings may not be drawn to scale. On the contrary, the dimensions of the various features may be arbitrarily expanded or reduced for clarity. Moreover, in the drawing, common numerical references are used to represent like features. Included in the drawing are the following figures:

FIG. 1 is a block diagram of a voice activity detector system in accordance with an embodiment;

FIG. 2 is a flow chart of a method for determining voice activity status in accordance with an embodiment herein; and FIG. 3 is an overview block diagram of a system for determining voice activity status in accordance with an embodiment herein.

DETAILED DESCRIPTION OF THE INVENTION

A new method and system is presented to robustly determined voice activity using typically two microphones mounted in a small earpiece. The determined voice activity status can be used to control the gain on a voice operated control system to gate the level of a signal directed to a second voice receiving system. This voice receiving system can be a voice communication system (e.g. radio or telephone system), a voice recording system, a speech to text system, a voice machine-control system. The gain of the voice operated control system is typically set to zero when no voice active is detected, and set to unity otherwise. The overall data rate in a voice communication system can therefore be adjusted, and large data rate reductions are possible: thereby increasing the number of voice communications channels and/or increasing the voice quality for each voice communication channel. The voice activity status can also be used to adjust the power used in a wireless voice communication system, thereby extending the battery life of the system.

FIG. 1 describes an exemplary overview or system 10 of an embodiment in accordance the present invention. In one exemplary embodiment, two microphones in an earphone are used to determine voice activity of the earphone wearer. The first microphone 12 is an ambient sound microphone, detecting sound in the ambient environment of the earphone wearer. The second microphone 13 is an ear-canal microphone detecting sound in the ear canal of the earphone wearer. In a preferred embodiment, the earphone incorporates a sound isolating or a partially sound isolating barrier to isolate the ear canal microphone from the ambient environment, where this barrier can be an inflatable balloon or foam plug. The microphones 12 and 13 can serve as inputs to a voice activity detector or VAD 14. The voice activity detector 14 can provide a VAD status to a gain update module 15. The gain update module 15 and the ear canal microphone 13 can provide inputs to an amplifier 16. The output from the gain update module 15 serves as the voice controller gain input signal to the amplifier 16. The amplifier 16 can provide an output signal 17 which can be used by a speaker 18 for example.

FIG. 2 describes a method 20 for determining the status of user voice activity of the earphone system in FIG. 1. The first and second microphone signals are received at 21 and 22 and are band pass filtered (or "band limited") and a power estimate of these filtered first and second microphone signals are calculated at 23 and 24 respectively. In the preferred embodiment, the band pass filtering is accomplished by a weighted FFT operation, familiar to those skilled in the art, with the signal power estimated between approximately 100 Hz and 2 kHz.

$$P\_1(t)=W*FFT(M\_1(t))$$

$$P\_2(t)=W*FFT(M\_2(t))$$

Where $P\_1(t)$ is the weighted power estimate of signal microphone 1 at time t.

W is a frequency weighting vector.

FFT( ) is a Fast Fourier Transform operation.

$M\_1(t)$ is the signal from the first microphone at time t.

$M\_2(t)$ is the signal from the second microphone at time t.

A fast-time weighted average of the two band pass filtered power estimates is calculated at 25 and 26 respectively, with a fast time constant which in the preferred embodiment is equal to 45 ms.

$$AV\_M1\_fast(t)=a*AV\_M1\_fast(t-1)+(a-1)*P\_1(t)$$

$$AV\_M2\_fast(t)=a*AV\_M2\_fast(t-1)+(a-1)*P\_1(t)$$

Where

AV_M1_fast(t) is the fast time weighted average of the first band pass filtered microphone signal.

AV_M2_fast(t) is the fast time weighted average of the second band pass filtered microphone signal.

a is a fast time weighting coefficient.

A slow-time weighted average of the two band pass filtered power estimates is calculated at 27 and 28 respectively, with a fast time constant which in the preferred embodiment is equal to 500 ms.

$$AV\_M1\_slow(0=b*AV\_M1\_slow(t-1)+(b-1)*P\_1(t)$$

$$AV\_M2\_slow(0=b*AV\_M2\_slow(t-1)+(b-1)*P\_1(t)$$

Where

AV_M1_slow(t) is the slow time weighted average of the first band pass filtered microphone signal.

AV_M2_slow(t) is the slow time weighted average of the second band pass filtered microphone signal.

b is a slow time weighting coefficient, where a>b.

The ratio of the two fast time weighted power estimates is calculated at 30 (i.e., the fast weighted power of the second microphone divided by the fast weighted power of the first microphone).

$$ratio\_fast(t)=AV\_M2\_fast(t)/AV\_M1\_fast(t)$$

The ratio of the two slow time weighted power estimates is calculated at 29 (ie the slow weighted power of the second microphone divided by the slow weighted power of the first microphone).

$$ratio\_slow(t)=AV\_M2\_slow(t)/AV\_M1\_slow(t)$$

The absolute difference of the two above ratio values is then calculated at 31.

$$diff(t)=abs(ratio\_fast(t)-ratio\_slow(t))$$

Note that the updating of the slow time weighted ratio in one embodiment is of the first filtered signal and the second filtered signal where the first filtered signal and the second filtered signal are the slow weighted powers of the first and second microphone signals. Similarly, updating of the fast time weighted ratio is of the first filtered signal and the second filtered signal where the first filtered signal and the second filtered signals are the fast weighted powers of the first and second microphone signals. As noted above, the absolute differences between the fast time weighted ratio and the slow time weighted ratios are calculated to provide a value.

This value is then compared with a threshold at 32, and if the value diff(t) is greater than this threshold, then we determine that voice activity is current in an active mode at 33, and the VOX gain value is updated at 34 or in this example increased (up to a maximum value of unity).

In one exemplary embodiment the threshold value is fixed.

In a second embodiment the threshold value is dependent on the slow weighted level AV_M1_slow.

In a third embodiment the threshold value is set to be equal to the time averaged value of the diff(t), for example calculated according to the following:

$$threshold(t)=c*threshold(t-1)+(c-1)*diff(t)$$

where c is a time smoothing coefficient such that the time smoothing is a leaky integrator type with a smoothing time of approximately 500 ms.

FIG. 3 is a diagram showing a high level overview of a system 35 to detect voice activity status. The system 35 uses a signal analysis system 41 to analyze at least 2 audio input signals (e.g., 37, 38, 39, and 40) to determine a voice activity status at 42, where this status can be a binary value (e.g., 0="no voice activity" and 1="voice activity", or the status can be a bounded probability value, e.g., between 0% and 100%, where the value is a probability likelihood of voice activity. The signal analysis system 41 can utilize the previously described method, where 2 input signals from a single earphone are used to determine a voice activity status. Alternative methods for determining voice activity can include algorithms using Singular Value Decomposition (SVD) or neural net systems.

Although the invention is illustrated and described herein with reference to specific embodiments, the invention is not intended to be limited to the details shown. Rather, various modifications may be made in the details within the scope and range of equivalents of the claims and without departing from the embodiments claimed.

I claim:

1. A method of adjusting a gain on a voice operated control system, comprising:
    determining a first slow time weighted ratio of a filtered first microphone signal and a filtered second microphone signal;
    determining a first fast time weighted ratio of the filtered first microphone signal and the filtered second microphone signal;
    determining a second slow time weighted ratio of the filtered first microphone signal and a filtered third microphone signal;
    determining a second fast time weighted ratio of the filtered first microphone signal and the filtered third microphone signal;
    comparing, with a first threshold, a first absolute difference between the first fast time weighted ratio and the first slow time weighted ratio;
    comparing, with a second threshold, a second absolute difference between the second fast time weighted ratio and the second slow time weighted ratio; and
    adjusting the gain on the voice operated control system when the first absolute difference is greater than the first threshold or the second absolute difference is greater than the second threshold, wherein a voice activity status is utilized to control the gain on the voice operated control system and to adjust a level of a signal directed to a voice receiving system in communication with the voice operated control system.

2. The method of claim 1, further comprising receiving a first microphone signal, a second microphone signal, and a third microphone signal.

3. The method of claim 2, further comprising filtering the first microphone signal to generate the filtered first microphone signal, filtering the second microphone signal to generate the filtered second microphone signal, and filtering the third microphone signal to generate the filtered third microphone signal.

4. The method of claim 1, further comprising determining the voice activity status based on the comparing of the first absolute difference or the second absolute difference.

5. The method of claim 1, further comprising updating the first fast time weighted ratio, the first slow time weighted ratio, the second fast time weighted ratio, the second slow time weighted ratio, or a combination thereof.

6. The method of claim 1, further comprising increasing the gain on the voice operated control system by adjusting a gain from a first microphone, adjusting a gain from a second microphone, adjusting a gain from a third microphone, or a combination thereof.

7. The method of claim 1, further comprising determining the voice activity status using singular value decomposition, a neural net system, a bounded probability value or a combination thereof.

8. The method of claim 1, further comprising generating the filtered first microphone signal, the filtered second microphone signal and the filtered third microphone signal by band pass filtering first, second, and third microphone signals respectively.

9. The method of claim 1, further comprising determining a power estimate of the filtered first microphone signal, the filtered second microphone signal, the filtered third microphone signal, or a combination thereof.

10. The method of claim 1, further comprising setting the gain of the voice operated control system to zero when no voice activity is detected.

11. The method of claim 1, further comprising adjusting a data rate in the voice receiving system.

12. A device for adjusting a gain on a voice operated control system, comprising:
    a processor; and
    a memory having computer instructions, wherein the instructions, when executed by the processor, cause the processor to perform operations comprising:
    calculating a first slow time weighted ratio of a filtered first microphone signal and a filtered second microphone signal;
        calculating a first fast time weighted ratio of the filtered first microphone signal and the filtered second microphone signal;
        comparing, with a first threshold, a first absolute difference between the first fast time weighted ratio and the first slow time weighted ratio;
        calculating a second slow time weighted ratio of the filtered first microphone signal and a filtered third microphone signal;
        calculating a second fast time weighted ratio of the filtered first microphone signal and the filtered third microphone signal;
        comparing, with a second threshold, a second absolute difference between the second fast time weighted ratio and the second slow time weighted ratio; and
        adjusting the gain on the voice operated control system when the first absolute difference is greater than the first threshold or the second absolute difference is greater than the second threshold, wherein a voice activity status is utilized to control the gain on the voice operated control system and to adjust a level of a signal directed to a voice receiving system in communication with the voice operated control system.

13. The device of claim 12, wherein the operations further comprise adjusting a power of the voice receiving system by utilizing the voice activity status.

14. The device of claim 12, wherein the operations further comprise determining the voice activity status by utilizing three microphones of the device.

15. The device of claim 12, wherein the operation further comprise reducing a data rate of the voice receiving system.

16. The device of claim 12, wherein the operations further comprise determining a power estimate of the filtered first microphone signal, the filtered second microphone signal, the filtered third microphone signal or a combination thereof.

17. The device of claim 12, wherein the operations further comprise calculating the first fast time weighted ratio based on a first fast time weighted average of the filtered first microphone signal that is calculated based on a first fast time weighting coefficient that is greater than a first slow time weighting coefficient utilized in a first slow time weighted average of the filtered first microphone signal utilized in calculating the first slow time weighted ratio.

18. The device of claim 12, wherein the operations further comprise calculating the first absolute difference between the first fast time weighted ratio and the first slow time weighted ratio.

19. The device of claim 12, wherein the operations further comprise setting the gain of the voice operated control system to zero when no voice activity is detected.

20. A method of adjusting a gain on a voice operated control system, comprising:
   determining a slow time weighted ratio of a filtered first microphone signal and at least one of a filtered second microphone signal and a filtered third microphone signal;
   determining a fast time weighted ratio of the filtered first microphone signal and at least one of the filtered second microphone signal and the filtered third microphone signal;
   calculating an absolute difference between the fast time weighted ratio and the slow time weighted ratio; and
   adjusting a gain on the voice operated control system when the absolute difference is greater than a threshold, wherein a voice activity status is utilized to control the gain on the voice operated control system and to adjust a level of a signal directed to a voice receiving system in communication with the voice operated control system.

* * * * *